United States Patent
Rivas-Rivera et al.

(10) Patent No.: US 11,942,957 B2
(45) Date of Patent: Mar. 26, 2024

(54) FIRMWARE-BASED INTERLEAVED-ADC GAIN CALIBRATION AND HARDWARE-THRESHOLDING ENHANCEMENTS

(71) Applicant: Analog Devices, Inc., Wilmington, MA (US)

(72) Inventors: Kevin R. Rivas-Rivera, San Diego, CA (US); Tao Conrad, Bedford, MA (US)

(73) Assignee: Analog Devices, Inc., Wilmington, MA (US)

( * ) Notice: Subject to any disclaimer, the term of this patent is extended or adjusted under 35 U.S.C. 154(b) by 243 days.

(21) Appl. No.: 17/670,943

(22) Filed: Feb. 14, 2022

(65) Prior Publication Data
US 2022/0263514 A1 Aug. 18, 2022

Related U.S. Application Data

(60) Provisional application No. 63/149,645, filed on Feb. 15, 2021.

(51) Int. Cl.
*H03M 1/06* (2006.01)
*H03M 1/10* (2006.01)
*H03M 1/12* (2006.01)

(52) U.S. Cl.
CPC ....... *H03M 1/0604* (2013.01); *H03M 1/1014* (2013.01); *H03M 1/1215* (2013.01)

(58) Field of Classification Search
CPC . H03M 1/0604; H03M 1/1014; H03M 1/1215
USPC .................................................. 341/118, 155
See application file for complete search history.

(56) References Cited

U.S. PATENT DOCUMENTS

| | | |
|---|---|---|
| 6,900,750 B1 | 5/2005 | Nairn |
| 7,916,050 B1 | 3/2011 | Mujica et al. |
| 8,749,410 B1 * | 6/2014 | Van Der Goes ........ H03M 1/06 341/120 |
| 8,872,680 B2 | 10/2014 | Ali |
| 9,264,059 B2 | 2/2016 | Tousi et al. |
| 9,401,726 B2 | 7/2016 | Ragab et al. |
| 9,503,116 B2 | 11/2016 | Speir et al. |

(Continued)

OTHER PUBLICATIONS

Kurosawa et al., *Explicit Analysis of Channel Mismatch Effects in Time-Interleaved ADC Systems*, IEEE Transactions on Circuits and Systems—I: Fundamental Theory and Applications, vol. 48, No. 3, Mar. 2001, 11 pages.

(Continued)

*Primary Examiner* — Khai M Nguyen
(74) *Attorney, Agent, or Firm* — Schwegman Lundberg & Woessner, P.A.

(57) ABSTRACT

The present disclosure enables firmware-based interleaved-ADC gain calibration and provides hardware-thresholding enhancements. An on-chip memory may store subADC samples and a microprocessor accesses these stored samples for use with the calibration algorithm. Power estimates may be performed using square of each subADC sample to estimate gain error. Thresholding may be applied to the subADC samples, such as Maximum Amplitude Thresholding, Minimum Power Thresholding, and/or using Histogram Output Memory, to determine that samples are valid and may be used for calibration or that subADC data are to be discarded and a new subADC data capture is to be started.

20 Claims, 9 Drawing Sheets

(56) References Cited

U.S. PATENT DOCUMENTS

| | | |
|---|---|---|
| 9,525,428 B2 | 12/2016 | Devarajan et al. |
| 9,654,133 B2 | 5/2017 | Speir et al. |
| 10,536,155 B1 | 1/2020 | Otte |
| 2017/0117914 A1* | 4/2017 | Choi .................. H03M 1/1033 |

OTHER PUBLICATIONS

Dyer et al., *An Analog Background Calibration Technique for Time-Interleaved Analog-to-Digital Converters*, IEEE Journal of Solid-State Circuits, vol. 33, No. 12, Dec. 1998, 8 pages.

Khan et al., *Hardware Feasible Offset and Gain Error Correction for Time-Interleaved ADC*, 2017 International SoC Design Conference (ISOCC), Nov. 5-8, 2017, 2 pages.

Qiu et al., *A Novel Calibration Method of Gain and Time-Skew Mismatches for Time-Interleaved ADCs Based on Neural Network*, 2019 IEEE MTT-S International Wireless Symposium (IWS), May 19-22, 2019, 3 pages.

Yin et al., *A Novel Gain Error Background Calibration Algorithm for Time-Interleaved ADCs*, 2014 International Conference on Anti-Counterfeiting, Security and Identification (ASID), Dec. 12-14, 2014, 4 pages.

Saleem, *Adaptive Blind Calibration of Gain and Timing Mismatches in a Time-Interleaved ADC—A Performance Analysis*, 2012 IEEE International Instrumentation and Measurement Technology Conference Proceedings, May 13-16, 2012, 6 pages.

* cited by examiner

FIRMWARE-BASED INTERLEAVED-ADC GAIN CALIBRATION AND HARDWARE-THRESHOLDING ENHANCEMENTS

PRIORITY APPLICATION

This patent application claims priority to and receives the benefit of US provisional application, having the same title, filed on 15 Feb. 2021, with Ser. No. 63/149,645. The provisional application is incorporated herein by reference in its entirety.

TECHNICAL FIELD OF THE DISCLOSURE

The present disclosure relates generally to analog-to-digital converters (ADCs) and, more specifically, to methods, electronic devices and integrated circuits for calibrating ADCs.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an ADC as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon, e.g., light, sound, temperature, or pressure for data processing purposes. Designing an ADC is a non-trivial task because each application may have different needs in performance, power, cost, and size. ADCs are used in a broad range of applications including communications, energy, healthcare, instrumentation and measurement, motor and power control, industrial automation and aerospace/defense.

Generally speaking ADCs are electronic devices that convert a continuous physical quantity carried by an analog signal to a digital number that represents the quantity's amplitude (or to a digital signal carrying that digital number). An ADC is typically composed of many devices making up an integrated circuit or a chip. An ADC is usually defined by the following application requirements: its bandwidth (the range of frequencies of analog signals it can properly convert to a digital signal), its resolution (the number of discrete levels the maximum analog signal can be divided into and represented in the digital signal), and its signal to noise ratio (how accurately the ADC can measure signal relative to the noise the ADC introduces). ADCs have many different designs, which can be chosen based on the application requirements.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

The present disclosure enables firmware-based interleaved-ADC gain calibration and provides hardware-thresholding enhancements. An on-chip memory may store subADC samples and a microprocessor accesses these stored samples for use with the calibration algorithm. Power estimates may be performed using square of each subADC sample to estimate gain error. Thresholding may be applied to the subADC samples, such as Maximum Amplitude Thresholding, Minimum Power Thresholding, and/or using Histogram Output Memory, to determine that samples are valid and may be used for calibration or that subADC data are to be discarded and a new subADC data capture is to be started.

The systems, methods and devices of this disclosure each have several innovative aspects, no single one of which is solely responsible for all of the desirable attributes disclosed herein. Details of one or more implementations of the subject matter described herein are set forth below and the accompanying drawings.

Time-Interleaved ADCs

Figure 1:
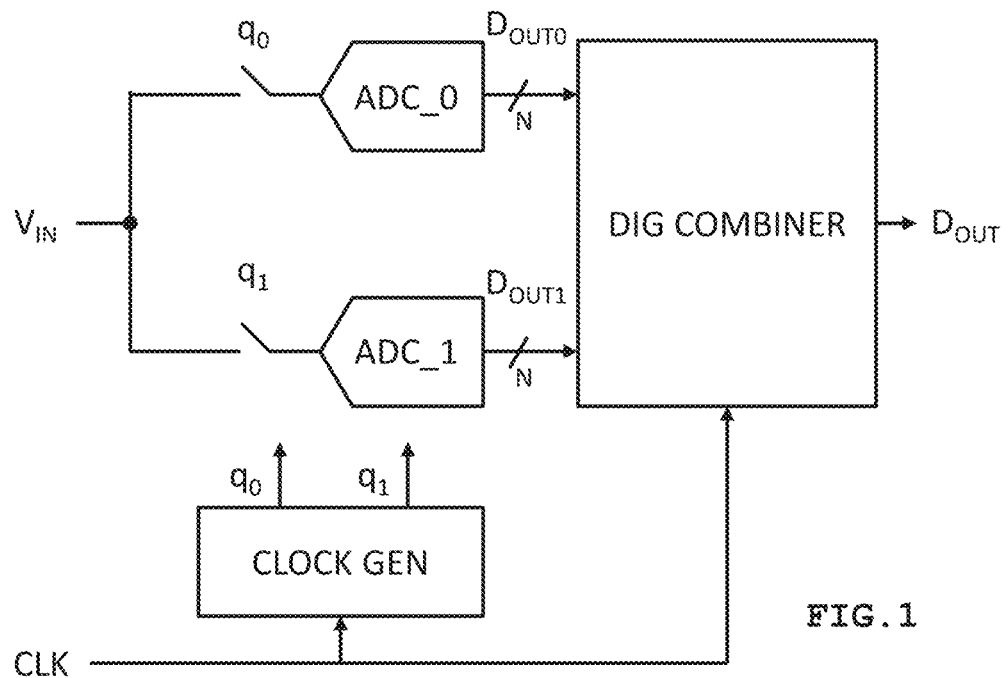
FIG. 1 shows an example time-interleaved ADC having two subADCs.
Figure 2:
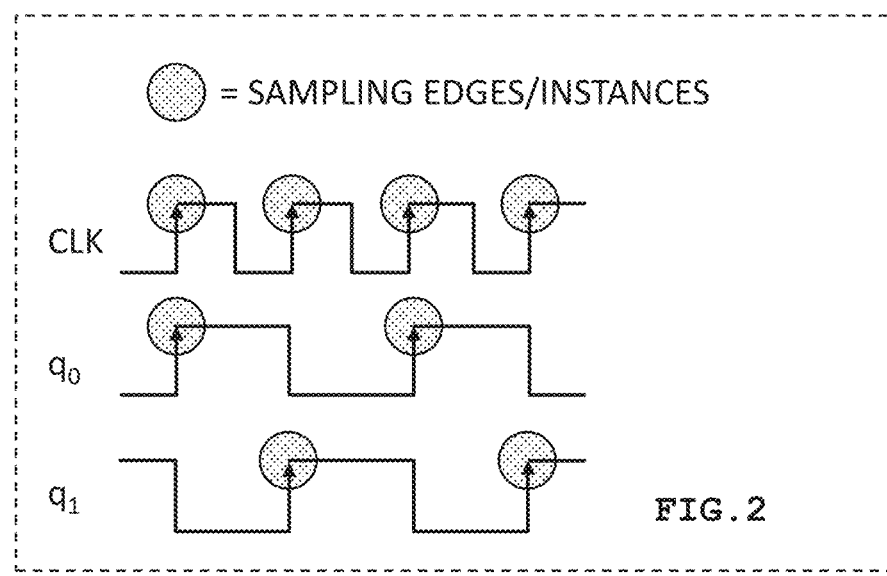
FIG. 2 shows a timing diagram illustrating sampling edges for the example time-interleaved ADC of FIG. 1.

There are many flavors of ADCs, each aiming to output a digital representation of the analog input provided to the ADC. An example flavor of ADCs is the time-interleaved ADC, where an ADC has K multiple subADCs (of any suitable architecture), which can run at a sample rate of 1/K of the overall system sample rate. Many (low-speed) ADCs can be used in parallel, operating in sequence in a time-interleaved fashion, using appropriate clocking, to increase the effective combined ADC sampling rate. FIG. 1 shows an example time-interleaved ADC having two subADCs, and FIG. 2 shows a timing diagram illustrating sampling edges for the example time-interleaved ADC of FIG. 1. In particular, FIG. 1 shows an example of a time-interleaved ADC having two subADCs, ADC_0 and ADC_1, each able to produce Y million samples per second (MS/s). The subADCs can produce N-bit samples. Together, with appropriate clocking shown in FIG. 2, the two subADCs can provide an overall sampling rate up to 2×Y MS/s. The appropriate clocking can be provided by clock generator ("clock gen" block) to produce clock signals or selection signals, q0 and q1, having different phases, to alternately select a subADC for converting the analog input signal to a digital output. Referring back to FIG. 1, the two subADCs, ADC_0 and ADC_1, alternately (i.e., in sequential order or according to a fixed sequence) sample the input signal $V_{in}$ and produce corresponding digital outputs, $D_{out0}$ and $D_{out1}$ respectively, which are then combined by the digital combiner ("dig combiner" block) to produce the Y MS/s digital output $D_{out}$. In this example, the subADCs operate according to a fixed sequence of [ . . . ADC_0, ADC_1, ADC_0, ADC_1, ADC_0, ADC_1, . . . ], e.g., in a round-robin fashion. A time-interleaved ADC having two subADC is described herein as an example for understanding the operations of a time-interleaved ADC, and is not intended to be limiting to the disclosure. Other time-interleaved ADCs having more than two subADCs are envisioned by the disclosure. Furthermore, time-interleaved ADCs having three or more subADCs can operate in a fixed sequence, a randomized sequence, or a pseudo-randomized sequence.

Two or more ADCs can sample, interleaved in time according to a randomized sequence or a pseudo-randomized sequence, the analog input. In such an example, the ADCs can be built fast enough that having as little as two ADCs can sample the analog input in a randomized sequence. In some embodiments, three or more ADCs can sample, interleaved in time according to a randomized sequence or pseudo-randomized sequence. In such an example, one or more of the three or more ADCs may be "busy", while two or more ones of the three or more ADCs may be "idle" (waiting to be selected/used). When the next sample is to be made, one of the "idle" ADCs can be selected at random from the ones which are "idle" to take the next sample in the pseudo-randomized sequence.

Another flavor of ADCs are multi-stage ADCs comprising multiple stages of analog-to-digital conversion, or multiple ADCs in cascade. Each stage generally includes an ADC. Stages can use the same or different ADC architectures to resolve different parts of digital output code. Typically, a first analog-to-digital conversion stage resolves the most significant bit(s) based on the analog input and generates an output for the second (following the first) analog-to-digital conversion stage. The output can be a residue representing the difference between the analog input and the digital output generated by a particular stage (i.e., the value of the most significant bit(s) resolved by the first stage). The second analog-to-digital conversion stage then performs analog-to-digital conversion on the residue signal to resolve further bit(s) of the digital output. The second stage can generate a further residue signal for following stage(s) of the multi-stage ADC. In some cases, a successive approximation register ADC can be considered a multi-stage ADC (e.g., if a segmented design is implemented to resolve the most significant bits using a simple ADC and further bits are resolved by a successive-approximation-register (SAR) charge distribution architecture). Residue type ADCs including two-step ADCs, algorithmic ADCs, and pipeline ADCs are also considered as multi-stage ADCs. While the algorithmic ADCs can reuse a single stage, each phase the single ADC is being reused can be considered a stage in the multi-stage ADC. Another form of multi-stage ADCs is a multi-stage noise shaping sigma-delta (MASH) ADC, comprising multiple stages of delta-sigma ADCs or a combination of other type(s) of ADCs (e.g., flash ADC) and delta-sigma ADC(s).

The above-described ADC architectures are not intended to be limiting to the disclosure. As will be appreciated by one skilled in the art, other architectures may be realized by the present disclosure.

Interleaved Gain Error

Figure 3:
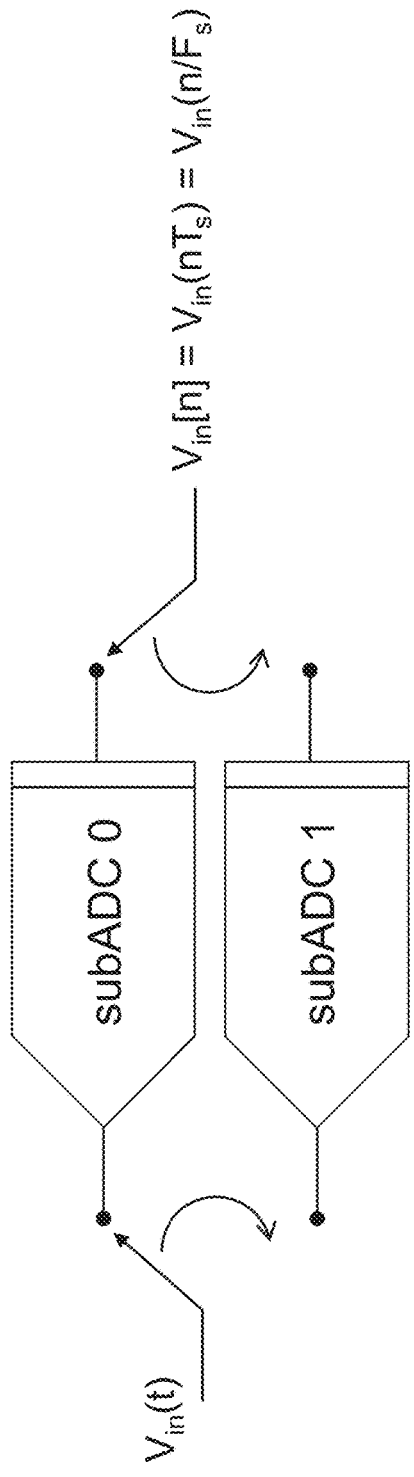
FIG. 3 is an illustrative block diagram of an ADC according to an embodiment of the present disclosure.

FIG. 3 shows another illustrative embodiment of a time-Interleaved ADC. Analog-to-digital conversion is the process of translating analog signals to digital values. An example is the conversion of human voice to digital values for storage and/or processing. Time-Interleaved means that there are two (or more) ADCs (each one called subADC or slice) sampling one at a time. In the example of FIG. 3, there are two subADCs shown. Each subADC samples $1/F_s$ seconds after the previous subADC. $F_s$ is the sampling rate of the overall ADC, i.e., the number of conversions that happen every second. t represents time. $T_s=1/F_s$ is the sampling period. n is an index to differentiate each sample.

Figure 4:
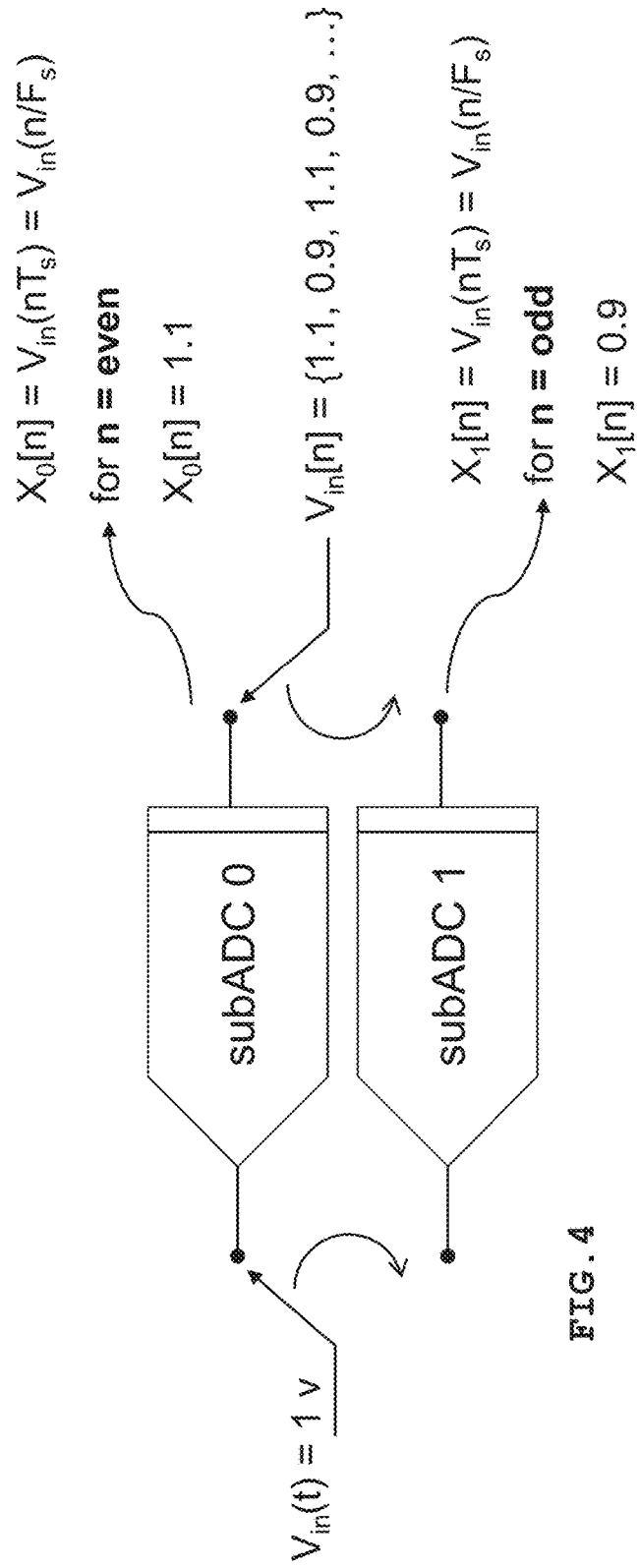
FIG. 4 is an illustrative block diagram of an ADC producing a gain error according to an embodiment of the present disclosure.

FIG. 4 is an illustrative block diagram of an ADC producing a gain error according to an embodiment of the present disclosure. The subADCs may be different instances of what is designed to be identical circuits within a chip. However, although designed to be identical, in practice some instances may differ from others, in different ways within the same chip, and from chip to chip, due to one or more process, voltage, and/or temperature (PVT) variations. One critical difference that may arise between different instances of subADCs is that of gain (i.e., the gains of different subADC may be different despite the fact that these subADCs may be designed to have the same gain). This may result in errors in conversion relative to each other. With reference to FIG. 4, for example, if an input voltage of 1 volt is provided to the interleaved ADC, one subADC may output "1.1" while the other may output "0.9". The gain error shows up at the output of the interleaved ADC as an oscillatory error, e.g., {1.1, 0.9, 1.1, 0.9, . . . }, as shown in the example of FIG. 4. Such oscillatory error may show up as spurs or tones in the output spectrum of the time-interleaved ADC. The difference in gain between subADCs can be referred to as interleaved gain error.

Example of Correcting a Gain Error

Figure 5:
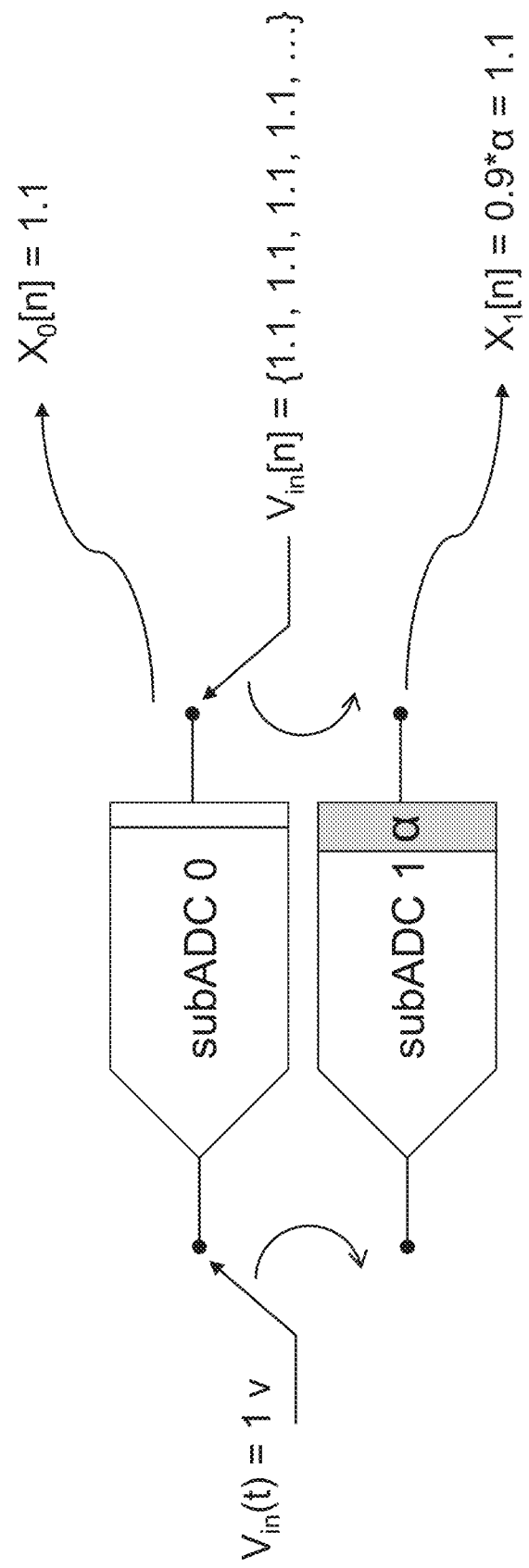
FIG. 5 is an illustrative block diagram of an ADC correcting a gain error according to an embodiment of the present disclosure.

FIG. 5 is an illustrative block diagram of an ADC correcting a gain error according to an embodiment of the present disclosure. With reference to the illustrative embodiment of FIG. 5, the gain error of one subADC may be estimated with respect to the other, and its gain may be adjusted (also called corrected or calibrated), as to reduce or minimize the interleaved gain error. For instance, circuitry and/or digital output of subADC1 may be adjusted until its output matches the output of subADC0. In the example of FIG. 5, output subADC1 is adjusted by a factor α=1.1/0.9=1.222 (approximately). The output of the overall ADC is 1.1, which has a small error, however, the interleaved error is reduced or gone, i.e., the output of the ADC of FIG. 5 is not oscillating as in FIG. 4, but is now a constant value {1.1, 1.1, 1.1, 1.1, . . . }, while a substantially constant voltage, e.g., 1 volt, is provided at its input.

Example of Gain Estimates

Figure 6:
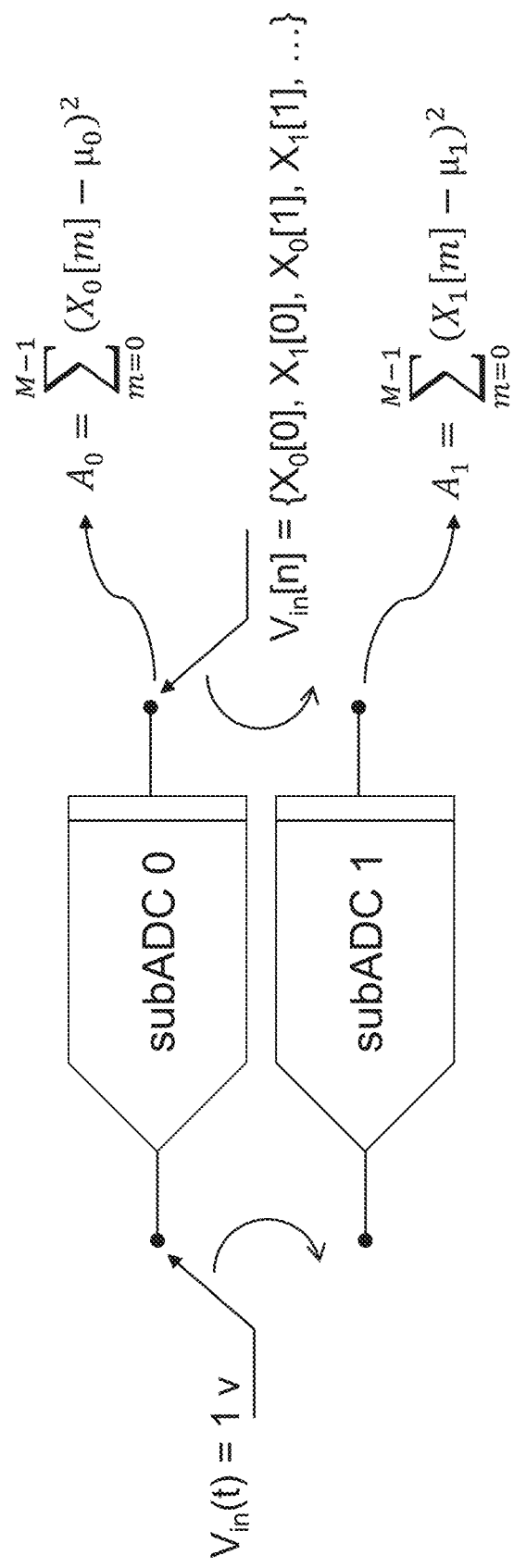
FIG. 6 is an illustrative block diagram of an ADC with gain estimates according to an embodiment of the present disclosure.

FIG. 6 is an illustrative block diagram of an ADC with gain estimates according to an embodiment of the present disclosure. Gain estimation is shown in the illustrative embodiment of FIG. 6. Different subADC gains may result in different output powers per subADC. This may be used to sense which subADC has higher or lower gain. For example, the power of the signal coming out of each subADC may be estimated, and the difference of these power estimate may indicate which subADC has the largest gain. In this example, "power" means summing the square $(X[m]^2)$ of the M subADC samples. M is the number of samples used for the power estimation. In some examples, M is a number of samples in a data block, or the data block size. In some embodiments, M is in the order of tens of thousands. The "mean", "offset," or "average" of a given subADC (labeled as $\mu_0$ and $\mu_1$ in FIG. 6) is subtracted from each subADC sample prior the squaring operation. The "mean" (or equivalents) can be computed by averaging the M subADC samples. Thus, the variance of the output of each subADC may be estimated. Phrased differently, each sample with the mean value removed is squared, and the squared value is summed over M samples. In mathematical terms, the power is $\Sigma_{m=0}^{M-1}(X[m]-\mu)^2$.

In FIG. 6, m is used as an index, wherein m may go from 0 to M−1 in steps of 1. Each m may be a different n for each subADC. Herein, n is an index for the overall interleaved-ADC. Herein, m is an index per subADC. In the example of FIG. 6, n=2m for subADC0 (because subADC0 has even n), while n=2m+1 for subADC1 (because subADC1 has odd n).

Figure 11:
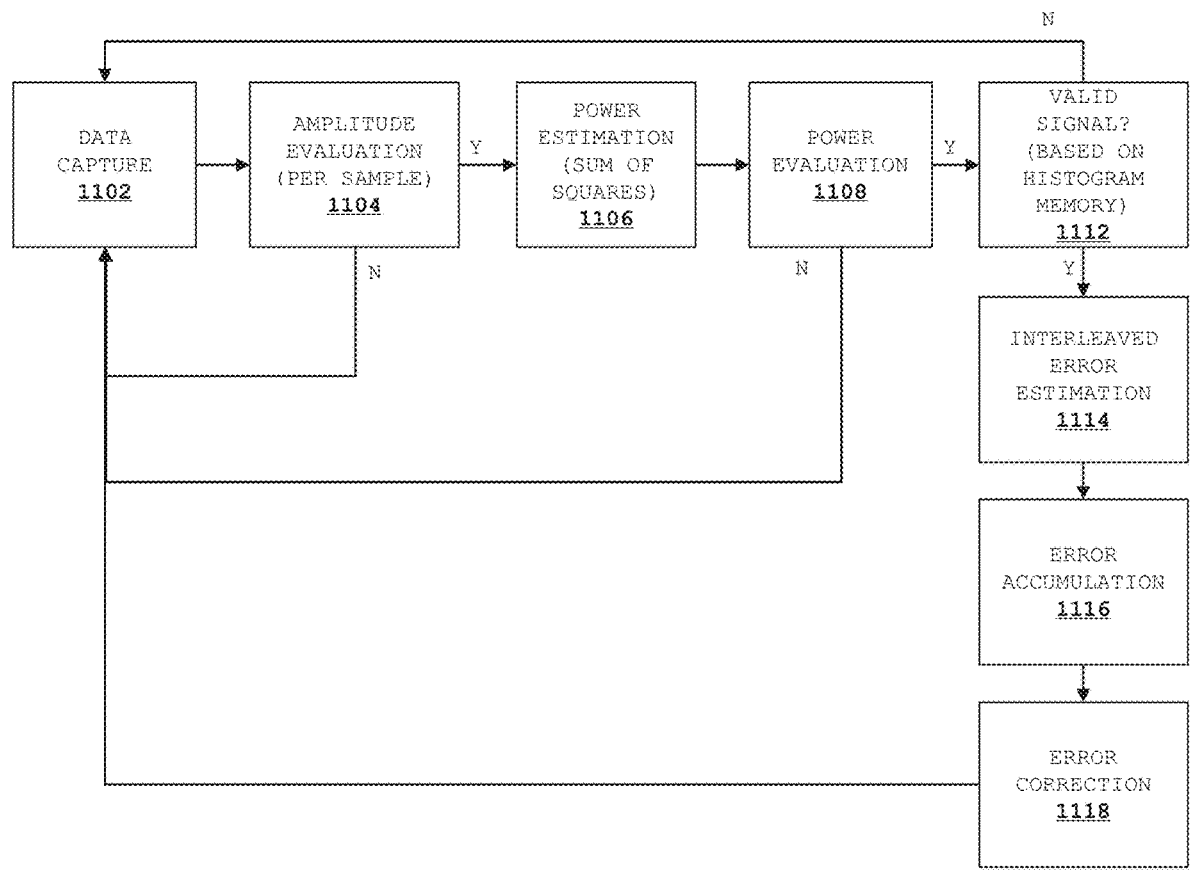
FIG. 11 is a flow diagram illustrating a firmware-based interleaved-ADC gain calibration and hardware-thresholding enhancements, according to an embodiment of the present disclosure.

Example of Thresholding to Determine if the Signal is Valid: Amplitude Evaluation and Power Evaluation In the example of FIG. 6, each of the $X_0[m]$ and $X_1[m]$ values may be compared to a "Maximum Amplitude Threshold," and if any exceeds this threshold, no calibration is performed, and the value may be discarded or a new subADC data capture is started, e.g., as shown in FIG. 11. For example, if $X_0[m]>$(Max Amplitude) or if $X_0[m]<-$(Max Amplitude), the signal may be too large and the value may be discarded from calibration. In some embodiments, the sample may be evaluated to determine if the sample is within a specific range of values (defined by a lower bound and an upper bound indicating a valid amplitude). If the sample is not within the range of values, then the sample fails to meet a valid amplitude condition.

In some embodiments, each of the $X_0[m]$ and $X_1[m]$ values may be compared to a "Minimum Amplitude Threshold," and if any is below this threshold, no calibration is performed, and the value may be discarded or a new subADC data capture is started. For example, if $X_0[m]<$(Min Amplitude) or if $X_0[m]>-$(Min Amplitude), the signal may be too small or non-existent and the value may be discarded from calibration.

In the example of FIG. 6, the power estimates $A_0$ and $A_1$ may be used to detect other invalid conditions, e.g., power is too low or power is too high, in which calibration may be unwanted and/or a new subADC data capture may be started. For example, if either $A_0$ or $A_1$ is below a "Minimum Power Threshold," it may be decided not to calibrate. In some cases, if $A_0$ or $A_1$ is above a "Maximum Power Threshold," it may be decided not to calibrate. In some embodiments, the power estimate may be evaluated to determine if the power is within a specific range of values (defined by a lower bound and an upper bound indicating a valid power). If the power is not within the range of values, then the power fails to meet a valid power condition.

Improvements to Amplitude Evaluation and Power Evaluation

A counter may be provided for any one or more of the threshold comparisons or evaluations to avoid considering the signal to be invalid too early, easily, or frequently. For instance, the sample value may need to exceed a "Maximum Amplitude Threshold" P number of times before the method considers the signal to be invalid. In another instance, past P evaluations of the sample value are stored and checked to see more than a predetermined number of the evaluations indicate that the sample value exceeds the "Maximum Amplitude Threshold", before the method considers the signal to be invalid.

A filter may be provided for any one or more of the threshold comparisons or evaluations to dampen noisy evaluations (e.g., singular or occasional crossing of the threshold) and avoid considering the signal to be invalid too early, easily, or frequently.

Logic may be provided to combine a suitable combination of threshold comparisons/evaluations to provide a final determination that the signal is invalid.

Such improvements can improve stability of the evaluations and overall calibration method.

Example of Interleaved Gain Error Estimate

Figure 7:
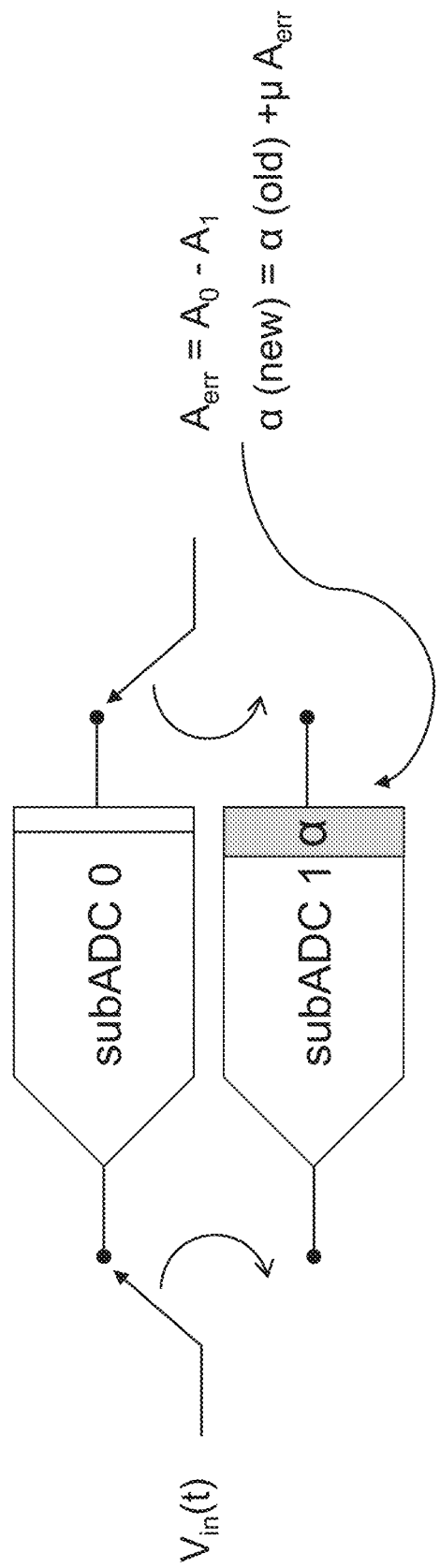
FIG. 7 is an illustrative block diagram of an ADC with interleaved gain error estimate according to an embodiment of the present disclosure.

FIG. 7 is an illustrative block diagram of an ADC with interleaved gain error estimate according to an embodiment of the present disclosure. In the illustrative embodiment of FIG. 7, an interleaved gain error may be calculated as: $A_{err}=A_0-A_1$. $A_{err}$ may be added with previous $A_{err}$ estimates (i.e., it may be accumulated) to update the correction value used to adjust the subADC's gain (i.e., to perform correction). Updating the correction value can be performed in a least means squared (LMS) loop. As seen in FIG. 7, the measured interleaved gain error, $A_{err}$, is multiplied by a timing constant $\mu$, and added to the old correction value $\alpha$(old) to determine the updated correction value $\alpha$(new). The accumulated, updated correction value, $\alpha$(new), is the value that may be used to adjust subADC1's gain. This is also a value shown in FIG. 5. The LMS loop, as it runs to iteratively update the correction value, may converge to reduce the measured interleaved gain error $A_{err}$ (e.g., making the measured interleaved gain error smaller and smaller), and to yield an updated correction value that is closer to the "true" correction value that would cause the gains of the subADCs to match.

Example of a Chip Implementing an ADC

The calibration process may be running continuously in background. This is to ensure good matching between subADCs as time goes by. The gain error will typically change as the chip's conditions change (temperature, input signal, sampling rate, supply, etc.). The calibration process preferably does not interrupt the output data of the interleaved-ADC, i.e., a user may operate the chip normally.

Figure 8:
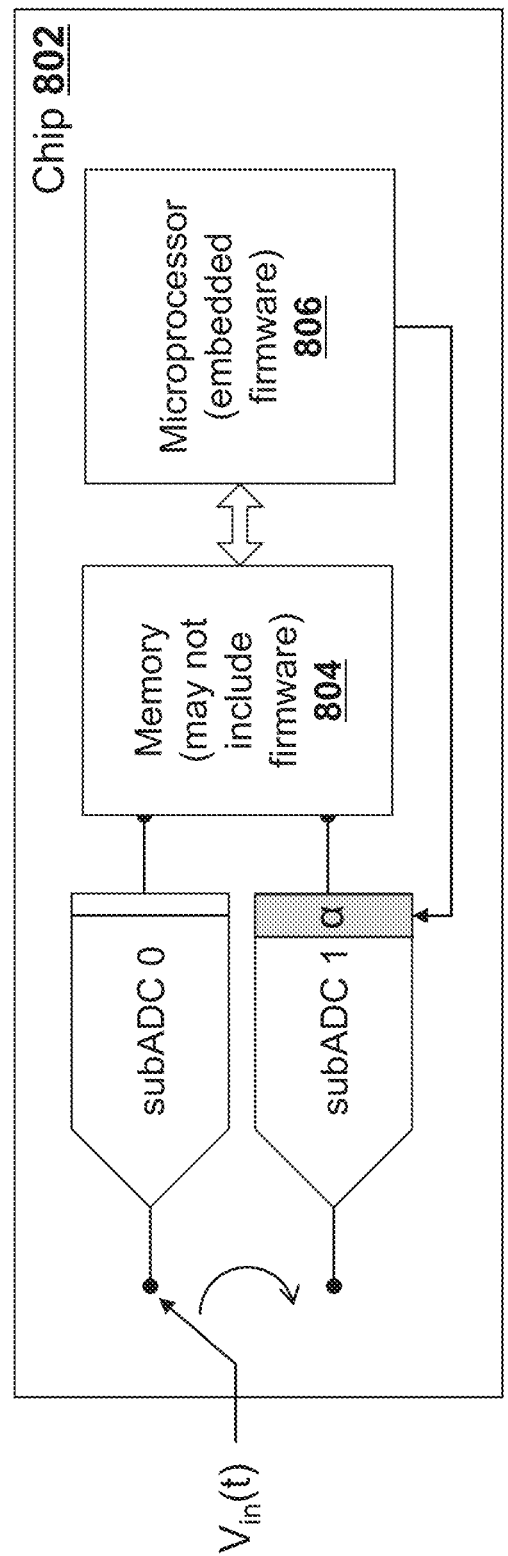
FIG. 8 is an illustrative block diagram of chip embedding an ADC according to an embodiment of the present disclosure.

FIG. 8 is an illustrative block diagram of chip embedding an ADC according to an embodiment of the present disclosure. As shown in the illustrative embodiment of FIG. 8, the calibration algorithm may be controlled by an on-chip microprocessor 806 in chip 802 that runs firmware with the calibration steps described above. The microprocessor may trigger a capture of M subADC samples on an on-chip random access memory 804. After capture is completed, the microprocessor may read the subADC samples and execute the algorithm. The microprocessor is preferably on-chip to make the implementation more efficient, since data capture and transfers to components off-chip can be inefficient, power hungry, and requires additional data interface hardware.

In some cases, one or more calculations/operations of the algorithm can be implemented in dedicated digital hardware as opposed to being implemented in firmware running on the microprocessor. The dedicated digital hardware can read and/or store samples or results of the calculations/operations in the on-chip random access memory.

Figure 9:
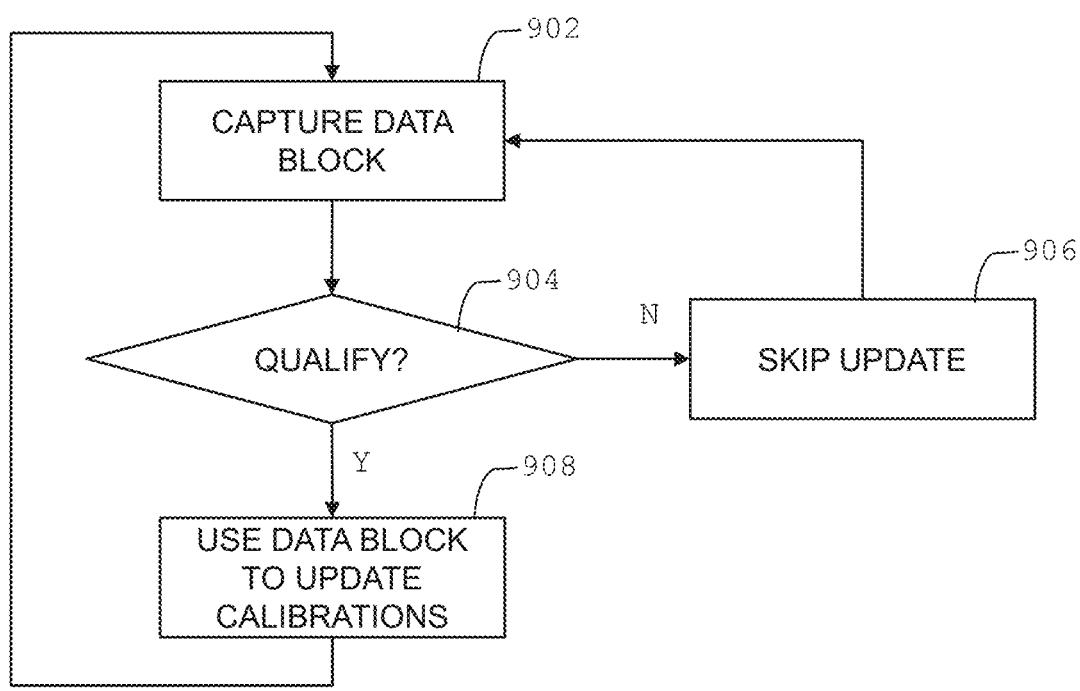
FIG. 9 is a flow diagram illustrating an example method for qualifying data used for background/blind calibration of interleaving errors, according to some embodiments of the disclosure.

Histogram-Based Qualification of Data used in Background or Blind Calibration of Interleaving Errors of Time-Interleaved ADCs FIG. 9 is a flow diagram illustrating an example method for qualifying data used for background/blind calibration of interleaving errors, according to some embodiments of the disclosure. The method may be part of the calibration algorithm controlled and/or executed by the on-chip microprocessor of FIG. 8. The method can identify problematic input conditions, such as coherent input frequencies. The method is distinct from checking samples or estimated gain values against thresholds.

In 902, a data block may be captured. The data block comprises (digital) output values generated by one of the plurality of time-interleaved ADCs (one of the subADCs). In some embodiments, a qualification histogram may be generated by a histogram function in a qualifier based on the values generated by one of the plurality of time-interleaved ADCs. Depending on the implementation, the histogram function may run in real time. In 904, the data block may be qualified by evaluating a variability measurement of a qualification histogram generated from the data block. A qualifier can measure an amount of clustering in a qualification histogram generated from the data block and output a qualification result based on the amount of clustering. In response to determining that the data block fails qualification ("N" path from 904), an update of the background/blind calibration of the interleaving error may be skipped (906). In response to determining that the data block qualifies ("Y" path from 904), the data block may be used to update the background/blind calibration of the interleaving error (908). An interleaving error calibration engine may be controllable by a qualification result from the qualifier. The qualification result may dictate whether the interleaving error calibration engine is to hold a previous value of an interleaving error correction coefficient or to update an interleaving error correction coefficient.

An interleaving error calibration engine may include an interleaving error extractor to derive the interleaving error and update an interleaving error correction coefficient based on the interleaving error. For instance, the interleaving error extractor may derive the iterleaving error from corrected output values. The interleaving calibration error engine may further include an interleaving error correction block to apply interleaving error correction coefficient to reduce the interleaving error. The interleaving error correction coefficient can be applied digitally to the uncorrected output values generated by the plurality of time-interleaved ADCs to generate corrected output values. A data combiner may combine the corrected output values to generate a final output $D_{out}$.

The signal range can dramatically change the variability measurement. A small signal can appear clustered in a few bins of the histogram since the full range of the histogram is not being exercised, which could lead the data block to fail qualification unnecessarily. To address this issue, a qualifier may perform a signal range check or perform a signal range estimate, and adjust the qualifier according to the signal range. In some cases, a qualifier can use a subset of the output values from a subADC for this purpose (e.g., during a first half of a calibration cycle), and use the rest of the output values (or all of the output values) to build a qualification histogram (e.g., during a second half of a calibration cycle). In some embodiments, a range histogram can be generated based on a first part of the data block (e.g., the subset of output values). A signal range may be estimated based on the range histogram. A qualifying histogram may be generated according to the signal range, based on the second part of the data block (e.g., the rest of the output values). If the signal is not changing frequently, the signal range estimate may be skipped in some cycles.

Figure 10:
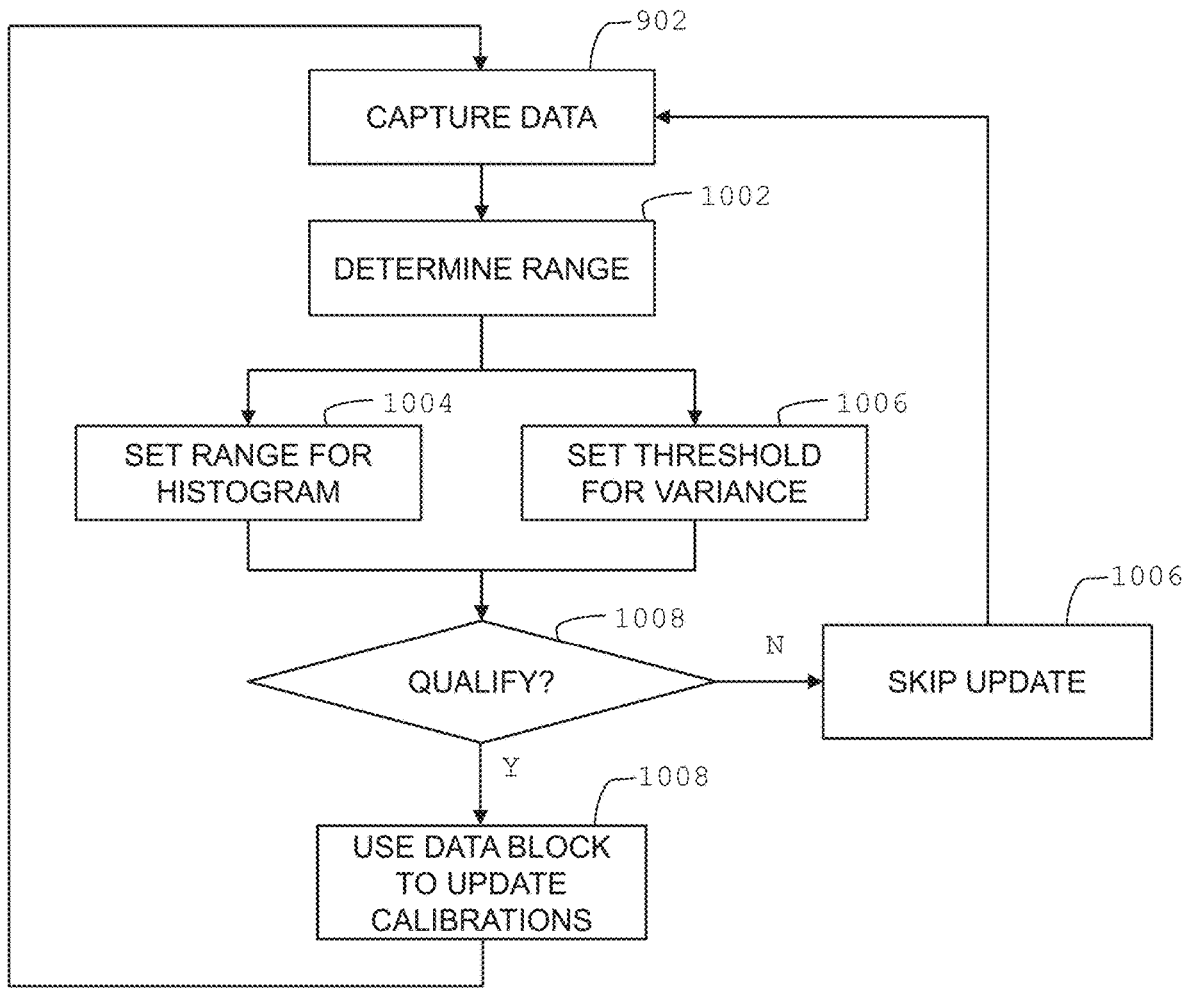
FIG. 10 is a flow diagram illustrating another example method for qualifying data used for background/blind calibration of interleaving errors, according to some embodiments of the disclosure.

FIG. 10 is a flow diagram illustrating another example method for qualifying data used for background/blind calibration of interleaving errors, according to some embodiments of the disclosure. The method may be part of the calibration algorithm controlled by the on-chip microprocessor 806 of FIG. 8.

In 1002, a signal range of the data block may be determined. In some embodiments, the signal range can be determined from a range histogram generated from the subset of output values. One or more upper empty bins of the range histogram may be an indicator of signal range. A smaller signal would leave upper bins empty since a small signal cannot exercise the full range of the range histogram. In 1004, a range for the qualification histogram may be set based on the signal range. For instance, the upper limit of the range for the qualification histogram may be shifted to the point where the one or more upper empty bins begin. In 1006, one or more programmable thresholds for evaluating the variability measurement of the qualification histogram may be set based on the signal range. This feature can allow the threshold to be adjustable for the signal range such than an optimum threshold with the appropriate sensitivity can be used for different signal ranges. In 1008, a qualification histogram may be generated, e.g., based on the range set in 1004 using the rest of the output values. The qualification histogram may be generated using only the most significant bits or some bits below the most significant bits. The latter works by binning any output value above the range in the top bin and binning any output value below the range in the bottom/zero bin. For a given range of the qualification histogram, values above the upper limit of the range may be collected in the highest (or "top") histogram bin. Based on the qualification histogram, one or more checks may be performed in 1008 to generate the qualification result.

Enhancement to the Histogram-Based Qualification of Data

A memory may be added, e.g., to the qualifier, to store the output from 1008. This enables to keep track of a number of P previous qualifier outputs. 908 may be configured to calibrate only if 1008 is "Y" for at least P calibration cycles. 908 may be configured not to calibrate if there is at least one single "N" in the P previous outputs. A counter, filter, or logic can be provided to evaluate the P previous qualifier outputs. Keeping track of the P previous outputs may be implemented in firmware, such as firmware running on microprocessor 806 of FIG. 8. The P previous qualifier outputs may be stored in memory 804 of FIG. 8.

Such enhancement can improve stability of the histogram-based qualifier and the overall calibration method.

Example of Combining Gain Estimation, Thresholding, and Histogram-Based Qualification of Data FIG. 11 is a flow diagram illustrating a firmware-based interleaved-ADC gain calibration with hardware-thresholding enhancements of an illustrative embodiment. The method may be part of the calibration algorithm controlled by the on-chip microprocessor 806 of FIG. 8.

In 1102, output data (e.g., output samples) is captured from a subADC. This data capture may be performed in the flow diagram of FIG. 9 or FIG. 10, e.g., in 902, as a part of 902 or separate from 902, but the present disclosure is not limited to the examples of FIG. 9 and FIG. 10.

In 1104, amplitude may be evaluated per sample, e.g., as described in the examples with reference to FIG. 6. In some cases, the evaluation may be based on several samples or a short block of samples instead of just one sample. In some embodiments, a sample or an absolute value of a sample may be compared against a threshold, such as a maximum amplitude threshold, and a minimum amplitude threshold. In hardware, it is possible to implement a thresholding operation based on one or more of the most significant bits. For instance, if a number of most significant bits of the sample all have the value zero, the amplitude of the sample may be too small.

In 1106, the power may be estimated using a sum of squares method, e.g., as described in the examples with reference to FIG. 6.

In 1108, the power may be evaluated, e.g., as described in the examples with reference to FIG. 6. In some cases, the evaluation may be based on several power values computed for several data blocks. The power can be compared against a threshold, such as a maximum power threshold, and a minimum power threshold. Based on thresholding, it may be determined whether or not the converted signal is valid, e.g., as described in the examples with reference to FIG. 6.

If the signal is found to be invalid (e.g., based on 1104 and/or 1108), then the subADC data may be discarded and a new subADC data capture may be started, e.g., (as illustrated by the N path out of 1104 and the N path out of 1118).

If the signal is found to be valid, the method proceeds to 1112, where it may be determined if the signal has a certain undesirable input condition (e.g., where the input frequency is a coherent sampling frequency that would cause the calibration to diverge or fail) based on the histogram memory, e.g., as described with FIG. 8, FIG. 9, and under the header "Enhancement to the histogram-based qualification of data". The histogram memory may be implemented as the memory 804 shown in FIG. 8. The histogram memory may be a part of the memory shown in FIG. 8.

If the signal is found to be invalid (based on histogram memory), then the subADC data may be discarded and a new subADC data capture may be started, e.g., illustrated by the N path out of 1112 in FIG. 11. If the signal is found to be valid (based on histogram memory), calibration proceeds to 1114, 1116, and 1118, illustrated by the Y path out of 1112 in FIG. 11.

In 1114, the interleaved error may be estimated, as described with FIG. 7.

In 1116, the error may be accumulated, as described with FIG. 7.

In 1118, the error may be corrected, e.g., as described with FIG. 5 and FIG. 7.

Whenever a new subADC data capture is started (following one of the N paths in FIG. 11), error extraction and calibration may be skipped and previously captured samples from a subADC may be discarded.

Parts of the illustrated method of FIG. 11 may be performed in parallel and not necessarily in the sequence shown. For instance, amplitude evaluation 1104 may be performed in parallel with power estimation 1106. In another instance, amplitude evaluation 1104 may be performed in parallel with power evaluation 1108. Other examples of parallelism and pipelining are envisioned by the disclosure.

Select Examples

Example 1 is a method to extract interleaving gain errors of a time-interleaved analog-to-digital converter having sub-analog-to-digital converters (subADCs) to sample an analog input signal in a time-interleaved manner, the method comprising: capturing a first data block of first output samples of a first subADC of the subADCs; evaluating whether one or more of the first output samples meet an amplitude condition; estimating a first power based on at least some of the first output samples of the first data block; evaluating whether the first power meets a power condition; qualifying, by a qualifier, whether first data block is suitable for interleaving gain error extraction; determining to proceed with extraction of a first interleaving gain error based on a memory storing a number of previous qualifier results from the qualifier; estimating the first interleaving gain error based the first power and a second power estimated based on second output samples of a second subADC of the subADCs.

In Example 2, the method of Example 1 can optionally include capturing the first data block comprising: triggering the capturing by an on-chip microprocessor; and storing the first data block in on-chip memory.

In Example 3, the method of Example 1 or 2 can optionally include evaluating whether the one or more of the first output samples meet the amplitude condition comprising: comparing one of the first output samples against a minimum amplitude threshold.

In Example 4, the method of any one of Examples 1-3 can optionally include evaluating whether the one or more of the first output samples meet the amplitude condition comprising: comparing one of the first output samples against a maximum amplitude threshold.

In Example 5, the method of any one of Examples 1-4 can optionally include evaluating whether the one or more of the first output samples meet the amplitude condition comprising: determining whether one of the first output samples is within a valid amplitude range.

In Example 6, the method of any one of Examples 1-5 can optionally include: in response to a result of the evaluating of the one or more of the first output samples indicating the analog input signal is invalid, discarding the first data block and starting a new capture of a second data block of second output samples of the first subADC.

In Example 7, the method of any one of Examples 1-6 can optionally include estimating the first power comprising: computing a sum of squares of the at least some of the first output samples.

In Example 8, the method of any one of Examples 1-7 can optionally include estimating the first power comprising: computing a variance of the at least some of the first output samples.

In Example 9, the method of any one of Examples 1-8 can optionally include estimating the first power comprising: for each sample of the first output samples in the first data block, removing a mean value from the sample and squaring a value of the sample with the mean value removed; and summing the squared values.

In Example 10, the method of any one of Examples 1-9 can optionally include evaluating whether the first power meets the power condition comprising: comparing the first power against a minimum power threshold.

In Example 11, the method of any one of Examples 1-10 can optionally include evaluating whether the first power meets the power condition comprising: comparing the first power against a maximum power threshold.

In Example 12, the method of any one of Examples 1-11 can optionally include evaluating whether the first power meets the power condition comprising: determining whether the first power is within a valid power range.

In Example 13, the method of any one of Examples 1-12 can optionally include in response to a result of the evaluating of the first power indicating that the analog input signal is invalid, discarding the first data block and starting a new capture of a second data block of second output samples of the first subADC.

In Example 14, the method of any one of Examples 1-13 can optionally include qualifying whether the first data block is suitable for interleaving gain error extraction comprising: applying a histogram function on the first data block; and determining that the first data block is suitable for interleaving gain error extraction based on a variability measurement of the histogram.

In Example 15, the method of any one of Examples 1-14 can optionally include determining to proceed with the extraction of the first interleaving gain error comprising: determining to proceed if all previous qualifier results indicate that a number of previous data blocks are suitable for interleaving gain error extraction.

In Example 16, the method of any one of Examples 1-15 can optionally include determining to proceed with the extraction of the first interleaving gain error comprising: determining to not proceed if at least one of the previous qualifier results indicate that at least one of a number of previous data blocks are not suitable for interleaving gain error extraction.

In Example 17, the method of any one of Examples 1-16 can optionally include in response to determining to not proceed with the extraction, discarding the first data block and starting a new capture of a second data block of second output samples of the first subADC.

In Example 18, the method of any one of Examples 1-17 can optionally include estimating the first interleaving gain error comprising: determining a difference between the first power and the second power.

In Example 19, the method of any one of Examples 1-18 can optionally include accumulating the estimated first interleaving gain error, using a time constant, with a previous estimate of the first interleaving gain error.

In Example 20, the method of any one of Examples 1-19 can optionally include applying a correction value to an output of one of the subADCs based on the first interleaving gain error.

Example 21 is a time-interleaved analog-to-digital converter, comprising: sub-analog-to-digital converters (subADCs) to sample an analog input signal in a time-interleaved manner; microprocessor on-chip with the subADCs; and memory; wherein the microprocessor is to: trigger a capture a first data block of first output samples of a first subADC of the subADCs in the memory; evaluate whether one or more of the first output samples meet an amplitude condition; estimate a first power based on at least some of the first output samples of the first data block; evaluate whether the first power meets a power condition; qualify, by a qualifier, whether first data block is suitable for interleaving gain error extraction; determine to proceed with extraction of a first interleaving gain error based on a memory storing a number of previous qualifier results from the qualifier; and estimate the first interleaving gain error based the first power and a second power estimated based on second output samples of a second subADC of the subADCs.

In Example 22, the time-interleaved analog-to-digital converter of Example 21 can optionally include the microprocessor further being to perform any one or more of the methods in Examples 2-20.

Example 23 is one or more computer-readable media having instructions stored thereon, wherein the instructions, when executed by one or more processors on-chip with a time-interleaved analog-to-digital converter having sub-analog-to-digital converters (subADCs) to sample an analog input signal in a time-interleaved manner, are to cause the one or more processors to perform the following: trigger a capture a first data block of first output samples of a first a of the subADCs in the memory; evaluate whether one or more of the first output samples meet an amplitude condition; estimate a first power based on at least some of the first output samples of the first data block; evaluate whether the first power meets a power condition; qualify, by a qualifier, whether first data block is suitable for interleaving gain error extraction; determine to proceed with extraction of a first interleaving gain error based on a memory storing a number of previous qualifier results from the qualifier; and estimate the first interleaving gain error based the first power and a second power estimated based on second output samples of a second subADC of the subADCs.

In Example 24, the one or more computer-readable media of Example 23 can optionally include the instructions are to cause the one or more processors to further perform: any one or more of the methods in Examples 2-20.

Example A is an apparatus comprising means to carry out any one or more of the methods in Examples 1-20.

Other Implementation Notes, Advantages, Variations, and Applications

Capture memory to store subADC samples, e.g., the memory shown in FIG. 8, may be an on-chip memory. The microprocessor, such as shown in FIG. 8, may access the stored samples to use with the algorithm, such as the algorithm shown in FIG. 11.

Power estimates using square of each subADC sample to estimate gain error, such as shown in FIG. 6, may be less sensitive to certain input conditions compared to commonly used absolute values to estimate gain error.

Thresholding, such as described in the examples with reference to FIG. 6 and in the example of FIG. 11, may include Maximum Amplitude Thresholding, Minimum Power Thresholding, and/or the Histogram Output Memory. Herein, histogram memory means that a previous P histogram outputs may be kept in memory. These may be stored in a different memory (e.g., as a firmware variable) than the memory used for subADC data capture. The thresholding ensures no calibration is performed under undesirable input conditions.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

It is also imperative to note that all of the specifications, dimensions, and relationships outlined herein (e.g., the number of modules/systems, logic operations, etc.) have only been offered for purposes of example and teaching only. Such information may be varied considerably without departing from the spirit of the present disclosure. The specifications apply only to some non-limiting examples and, accordingly, they should be construed as such. In the foregoing description, example embodiments have been described with reference to particular arrangements of components. The description and drawings are, accordingly, to be regarded in an illustrative rather than in a restrictive sense.

Note that with the numerous examples provided herein, interaction may be described in terms of two, three, four, or more components. However, this has been done for purposes of clarity and example only. It should be appreciated that the system can be consolidated in any suitable manner. Along similar design alternatives, any of the illustrated components, modules, and elements of the drawings may be combined in various possible configurations, all of which are clearly within the broad scope of the present disclosure.

Note that in the present description, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications. Note that all optional features of the systems and methods described above may also be implemented with respect to the methods or systems described herein and specifics in the examples may be used anywhere in one or more embodiments.

As will be appreciated by one skilled in the art, aspects of the present disclosure may be embodied in various manners (e.g., as a method, a system, a computer program product, or a computer-readable storage medium). Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g., one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon.

The detailed description presents various descriptions of specific certain embodiments. However, the innovations described herein can be embodied in a multitude of different ways, for example, as defined and covered by the select examples. In the description, reference is made to the drawings, where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The disclosure describes various illustrative embodiments and examples for implementing the features and functionality of the present disclosure. While particular components, arrangements, and/or features are described below in connection with various example embodiments, these are merely examples used to simplify the present disclosure and are not intended to be limiting. It will of course be appreciated that in the development of any actual embodiment, numerous implementation-specific decisions must be made to achieve the developer's specific goals, including compliance with system, business, and/or legal constraints, which may vary from one implementation to another. Moreover, it will be appreciated that, while such a development effort might be complex and time-consuming, it would nevertheless be a routine undertaking for those of ordinary skill in the art having the benefit of this disclosure.

In the present disclosure, reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as "above", "below", "upper", "lower", "top", "bottom", or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions or other characteristics (e.g., time, pressure, temperature, length, width, etc.) of an element, operations, and/or conditions, the phrase "between X and Y" represents a range that includes X and Y. If used, the terms "substantially," "approximately," "about," etc., may be used to generally refer to being within +/−20% of a target value, e.g., within +/−10% of a target value, based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" or notation "A/B/C" mean (A), (B), (C), (A and B), (A and C), (B and C), or (A, B, and C).

What is claimed is:

1. A method to extract interleaving gain errors of a time-interleaved analog-to-digital converter having sub-analog-to-digital converters (subADCs) to sample an analog input signal in a time-interleaved manner, the method comprising:
capturing a first data block of first output samples of a first subADC of the subADCs;
evaluating whether one or more of the first output samples meet an amplitude condition;
estimating a first power based on at least some of the first output samples of the first data block;
evaluating whether the first power meets a power condition;
qualifying, by a qualifier, whether first data block is suitable for interleaving gain error extraction;
determining to proceed with extraction of a first interleaving gain error based on a memory storing a number of previous qualifier results from the qualifier; and
estimating the first interleaving gain error based the first power and a second power estimated based on second output samples of a second subADC of the subADCs.

2. The method of claim 1, wherein capturing the first data block comprises:
triggering the capturing by an on-chip microprocessor; and
storing the first data block in on-chip memory.

3. The method of claim 1, wherein evaluating whether the one or more of the first output samples meet the amplitude condition comprises:
comparing one of the first output samples against a minimum amplitude threshold.

4. The method of claim 1, wherein evaluating whether the one or more of the first output samples meet the amplitude condition comprises:
comparing one of the first output samples against a maximum amplitude threshold.

5. The method of claim 1, wherein evaluating whether the one or more of the first output samples meet the amplitude condition comprises:
determining whether one of the first output samples is within a valid amplitude range.

6. The method of claim 1, further comprising:
in response to a result of the evaluating of the one or more of the first output samples indicating the analog input signal is invalid, discarding the first data block and starting a new capture of a second data block of second output samples of the first subADC.

7. The method of claim 1, wherein estimating the first power comprises:
computing a sum of squares of the at least some of the first output samples.

8. The method of claim 1, wherein estimating the first power comprises:
computing a variance of the at least some of the first output samples.

9. The method of claim 1, wherein estimating the first power comprises:
for each sample of the first output samples in the first data block, removing a mean value from the sample and squaring a value of the sample with the mean value removed; and
summing the squared values.

10. The method of claim 1, wherein evaluating whether the first power meets the power condition comprises:
comparing the first power against a minimum power threshold.

11. The method of claim 1, wherein evaluating whether the first power meets the power condition comprises:
comparing the first power against a maximum power threshold.

12. The method of claim 1, wherein evaluating whether the first power meets the power condition comprises:
determining whether the first power is within a valid power range.

13. The method of claim 1, further comprising:
in response to a result of the evaluating of the first power indicating that the analog input signal is invalid, discarding the first data block and starting a new capture of a second data block of second output samples of the first subADC.

14. The method of claim 1, wherein qualifying whether the first data block is suitable for interleaving gain error extraction comprises:
applying a histogram function on the first data block; and
determining that the first data block is suitable for interleaving gain error extraction based on a variability measurement of the histogram.

15. The method of claim 1, wherein determining to proceed with the extraction of the first interleaving gain error comprises:
determining to proceed if all previous qualifier results indicate that a number of previous data blocks are suitable for interleaving gain error extraction.

16. The method of claim 1, wherein determining to proceed with the extraction of the first interleaving gain error comprises:
determining to not proceed if at least one of the previous qualifier results indicate that at least one of a number of previous data blocks are not suitable for interleaving gain error extraction.

17. The method of claim 1, further comprising:
in response to determining to not proceed with the extraction, discarding the first data block and starting a new capture of a second data block of second output samples of the first subADC.

18. The method of claim 1, wherein estimating the first interleaving gain error comprises:
determining a difference between the first power and the second power.

19. A time-interleaved analog-to-digital converter, comprising:
sub-analog-to-digital converters (subADCs) to sample an analog input signal in a time-interleaved manner;
microprocessor on-chip with the subADCs; and
memory;
wherein the microprocessor is to:
trigger a capture a first data block of first output samples of a first subADC of the subADCs in the memory;
evaluate whether one or more of the first output samples meet an amplitude condition;
estimate a first power based on at least some of the first output samples of the first data block;
evaluate whether the first power meets a power condition;
qualify, by a qualifier, whether first data block is suitable for interleaving gain error extraction;
determine to proceed with extraction of a first interleaving gain error based on a memory storing a number of previous qualifier results from the qualifier; and
estimate the first interleaving gain error based the first power and a second power estimated based on second output samples of a second subADC of the subADCs.

20. One or more computer-readable media having instructions stored thereon, wherein the instructions, when executed by one or more processors on-chip with a time-interleaved analog-to-digital converter having sub-analog-to-digital converters (subADCs) to sample an analog input signal in a time-interleaved manner, are to cause the one or more processors to perform the following:
trigger a capture a first data block of first output samples of a first subADC of the subADCs;
evaluate whether one or more of the first output samples meet an amplitude condition;
estimate a first power based on at least some of the first output samples of the first data block;
evaluate whether the first power meets a power condition;
qualify, by a qualifier, whether first data block is suitable for interleaving gain error extraction;
determine to proceed with extraction of a first interleaving gain error based on a memory storing a number of previous qualifier results from the qualifier; and estimate the first interleaving gain error based the first power and a second power estimated based on second output samples of a second subADC of the subADCs.

* * * * *